(12) United States Patent (10) Patent No.: US 8,277,162 B2
Na et al. (45) Date of Patent: Oct. 2, 2012

(54) UNIT FOR OPENING INSERT FOR TEST TRAY AND METHOD OF MOUNTING SEMICONDUCTOR DEVICE USING THE SAME

(75) Inventors: Yun Sung Na, Cheonan-si (KR); Tae Hung Ku, Suwon-si (KR); Jung Woo Hwang, Hwaseong-si (KR)

(73) Assignee: Techwing Co., Ltd., Hwaseong-Si, Gyeonggi-Do (KR)

( * ) Notice: Subject to any disclaimer, the term of this patent is extended or adjusted under 35 U.S.C. 154(b) by 415 days.

(21) Appl. No.: 12/407,454

(22) Filed: Mar. 19, 2009

(65) Prior Publication Data

US 2009/0245982 A1   Oct. 1, 2009

(30) Foreign Application Priority Data

Mar. 25, 2008  (KR) .................. 10-2008-0027448

(51) Int. Cl.
*B65G 1/00* (2006.01)

(52) U.S. Cl. ............. 414/281; 269/56; 324/763; 428/34
(58) Field of Classification Search .................. 414/281; 269/56; 324/763; 428/34
See application file for complete search history.

(56) References Cited

U.S. PATENT DOCUMENTS 7,061,101 B2 *   6/2006   Ham et al. ................. 257/712
\* cited by examiner

*Primary Examiner* — Saul Rodriguez
*Assistant Examiner* — Willie Berry, Jr.
(74) *Attorney, Agent, or Firm* — BainwoodHuang

(57) ABSTRACT

A unit for opening an insert of a test tray which comprises an accommodating space for accommodating a semiconductor device and a support for supporting the semiconductor device accommodated in the accommodating space, the unit includes a body, a pair of opening devices provided in the body to open the insert, and a positioning guide unit protruding to be inserted into an accommodating space for a semiconductor device when opening the insert and supporting the semiconductor device that is transferred into the accommodating space to be spaced upward apart from a support provided in the accommodating space.

11 Claims, 6 Drawing Sheets

UNIT FOR OPENING INSERT FOR TEST TRAY AND METHOD OF MOUNTING SEMICONDUCTOR DEVICE USING THE SAME

FIELD OF THE INVENTION

The present invention relates to a unit for opening an insert for a test tray that prevents damage to a semiconductor device and a test equipment for the semiconductor device due to abnormal mounting of the semiconductor device by guiding the semiconductor device to be normally mounted in the insert, and a method of mounting a semiconductor device using the same.

BACKGROUND OF THE INVENTION

In general, a test handler supports testing of a tester by circulating a semiconductor device manufactured by a predetermined manufacturing process along a preset path and loads the semiconductor device on a customer tray after classifying the semiconductor device according to its grade. Test handlers are disclosed in many published documents.

Such a test handler includes a test tray (also, referred to as a 'carrier board') in which a plurality of semiconductor devices can be loaded to circulate the semiconductor devices along a preset path. Therefore, after a test handler mounts untested semiconductor devices from the customer tray in the test tray, and circulates the test tray in which the semiconductor devices are loaded along a preset path to support a test for the semiconductor devices loaded in the test tray, and transfers the semiconductor devices back to the customer tray when the test for the semiconductor devices loaded on the test tray is completed.

In the test tray provided in a test handler, a plurality of inserts is arranged in the form of a matrix in a rectangular frame, and semiconductor devices are loaded in the inserts, respectively.

Meanwhile, the test tray needs to be circulated along the preset path and its posture is converted from a horizontal state into a vertical state and vice versa according to type of the test tray. However, since semiconductor devices may be separated from the test tray during the circulation process of a test tray including the conversion of posture, holding units are provided in the inserts arranged in the test tray to maintain the holding state of the loaded semiconductor devices and to release the holding state with opening devices such that the semiconductor devices are loaded and unloaded.

Hereinafter, the insert of the test tray for an existing test handler and the insert opening unit will be described with reference to the accompanying drawings as follows.

FIG. 1 is a side sectional view illustrating an insert and an insert opening unit for a test tray in accordance with a prior art, and FIG. 2 is a plan view of the insert shown in FIG. 1.

As illustrated, an insert 10 of a test tray includes a housing 11 having an accommodating space 11a into which a semiconductor device 1 is accommodated and a pair of holding units 12 installed in the housing 11.

The accommodating space 11a formed in the housing 11 has a depth from the top surface of the housing 11 and a semiconductor device 1 is accommodated and positioned therein. Installing spaces 11b are formed at both side of the accommodating spaces 11a and spring fixing protrusions 11c protrude downwardly from respective upper sides of the installing spaces 11b. Hinge holes 11d are formed on the lower sides directly facing the spring fixing protrusions 11c. Support bosses 11e protrude upward from positions of the lower ends of the installing spaces 11b, where are spaced apart from the hinge holes 11d toward the accommodating space 11a, and position determining holes 11f are formed on the right and left sides of the housing 11. A support 11g is formed at a bottom of the accommodating space 11a to support a semiconductor device when the semiconductor device is mounted.

Each of the holding units 12 includes a holding member 12a, a locking member 12b, and a spring 12c.

The holding member 12a includes one side coupled to the hinge hole 11d of the housing 11 by a hinge pin 12d and the opposite side protruding toward the accommodating space 11a to be rotated about the hinge pin 12d. The upper surface of the holding member 12a forms a curved surface in the lateral direction of the accommodating space 11a, and a locking step 12e is formed on the curved surface. The holding member 12a opens the accommodating space 11a so that the semiconductor device 1 is loaded on the lower portion of the accommodating space 11a due to rotation of the semiconductor device 1 and closes the accommodating space 11a so that the semiconductor device 1 loaded on the lower portion of the accommodating portion 11a is held.

In the locking member 12b, a spring supporting protrusion 12f corresponding to the spring fixing protrusion 11c is formed at an upper portion thereof, and the ends of the spring 12c are fixed to the spring fixing protrusion 11c and the spring supporting protrusion 12f to be elastically supported and moved upward and downward within the installing space 11b. A locker 12g formed at a side of the locking member 12b restricts rotation of the holding member 12a through coupling to and separation from a locking step 12e of the holding member 12a to allow the holding member 12a to hold and release the semiconductor device 1.

When the insert 10 of the test tray is loaded in the test handler, that is, when the semiconductor device 1 is loaded in and unloaded from the test tray, it is necessary to open the accommodating space 11a by the holding units 12 to pick up the semiconductor device 1 and transfer the semiconductor device 1 from the test tray to another place. To this end, an insert opening device is required.

The respective insert opening devices are provided in a loader and an unloader of the test handler such that an insert opening unit 20 opening the insert 10 is arranged in the same matrix as that of the insert 10, respectively.

The insert opening unit 20 includes position determining protrusions 21 protruding upward to correspond to the position determining holes 11f of the housing 11, releasing pins 22 protruding upward from the vertical lower side of the locking members 12b to raise the locking members 12b protrude upward, and opening pins 23 protruding upward to open the accommodating space 11a by rotating the holding members 12a.

The operation of the insert 10 and the insert opening unit 20 according to the related art will be described as follows.

When a test tray is transferred and is stopped at a preset position, the insert opening unit 20 is raised and the position determining protrusions 21 are inserted into the position determining holes 11f of the housing 11 so that a proper position between the insert opening unit 20 and the insert 10 is determined. When the insert opening unit 20 is further raised, the releasing pins 22 press and raise the bottom ends of the locking members 12b, such that the lockers 23 of the locking members 12b are releases from the locked state by the locking steps 12e of the holding members 12a and the opening pins 23 push the holding members 12a upward to rotate the holding members 12a about the hinge pins 12d and then the accommodating space 11a of the housing 11 is opened.

When the accommodating space 11a of the housing 11 is opened, a pick and place device mounts the semiconductor device 1 to the support 11g at the bottom end of the accommodating space 11a, the insert opening unit 20 is lowered such that the opening pins 23 and the releasing pins 22 are separated from the holding members 12a and the locking members 12b and the locking members 12b are lowered and returned to their initial positions due to the elastic force of the springs 12c such that the holding members 12a rotate about the hinge pins 12d and return to their initial positions to hold both sides of the semiconductor device 1.

As described above, in the existing insert for a test tray, the semiconductor device 1 transferred into the accommodating space 11a, as illustrated in FIGS. 1 and 2, cannot be properly positioned at a preset position on the support 11g due to an error occurring in the pick and place device, a physical external force, and other causes. Accordingly, the semiconductor device 1 cannot be securely held, being separated from the accommodating space 11a or damaged during the transfer. Then, the separated and damaged semiconductor device 1 badly influences peripheral devices, deteriorates the yield rate and operation rate of the equipment, causing damage to test equipment due to an abnormal test performed while the semiconductor device 1 is being abnormally mounted in the accommodating space 11a.

SUMMARY OF THE INVENTION

Therefore, the present invention is made in view of the above problems, and an object of the present invention is to provide a unit for opening an insert for a test tray that prevents a semiconductor device from being separated and damaged during the transferring of the semiconductor device for a test due to abnormal mounting of the semiconductor in the insert and that prevents test equipment from being damaged due to a test performed with a semiconductor device being abnormally mounted, and a method for mounting a semiconductor device using the same.

In accordance with an aspect of the present invention, there is provided a unit for opening an insert of a test tray which includes an accommodating space for accommodating a semiconductor device and a support for supporting the semiconductor device accommodated in the accommodating space, the unit includes:

a body;

a pair of opening devices provided in the body to open the insert; and a positioning guide unit protruding to be inserted into the accommodating space when opening the insert and supporting the semiconductor device that is transferred into the accommodating space to be spaced upward apart from the support.

In accordance with another aspect of the present invention, there is provided a method of transferring a semiconductor device into an accommodating space of an insert for a test tray to be mounted to a support provided in the accommodating space, the method includes:

opening the accommodating space;

transferring the semiconductor device into the accommodating space;

supporting the semiconductor device transferred into the accommodating space to be spaced upwardly apart from the support; and lowering the semiconductor device to be positioned on the support and closing the accommodating space to hold the semiconductor device therein.

According to the present invention, after a semiconductor device transferred into an accommodating space of an insert is supported with the semiconductor device being spaced upward apart from a support, that is, a final position, the semiconductor device is lowered and guided and is normally positioned at a preset position on the support. Therefore, a semiconductor is prevented from being abnormally mounted and being separated and damaged in the process of transferring the semiconductor device for a test. Moreover, a semiconductor is prevented from being tested with the semiconductor being abnormally mounted to prevent test equipment from being damaged.

BRIEF DESCRIPTION OF THE DRAWINGS

The above and other aspects and features of the present invention will become apparent from the following description of preferred embodiments given in conjunction with the accompanying drawings, in which.

DETAILED DESCRIPTION OF THE EMBODIMENTS

Hereinafter, exemplary embodiments of the present invention will be described in detail with reference to the accompanying drawings. In the description of the present invention, a detailed description of related known structures and functions will be omitted to avoid obscuring the scope of the present invention.

Figure 1:
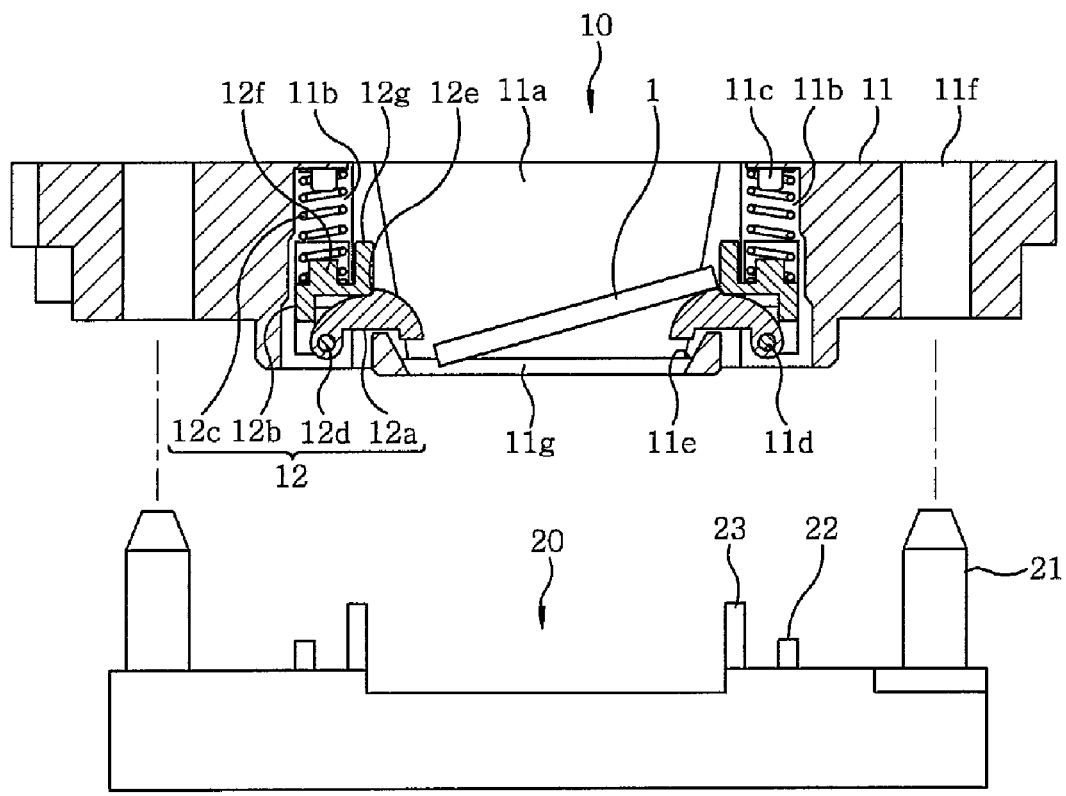
FIG. 1 is a side sectional view illustrating an insert and an insert opening unit for a test tray in accordance with a prior art.
Figure 2:
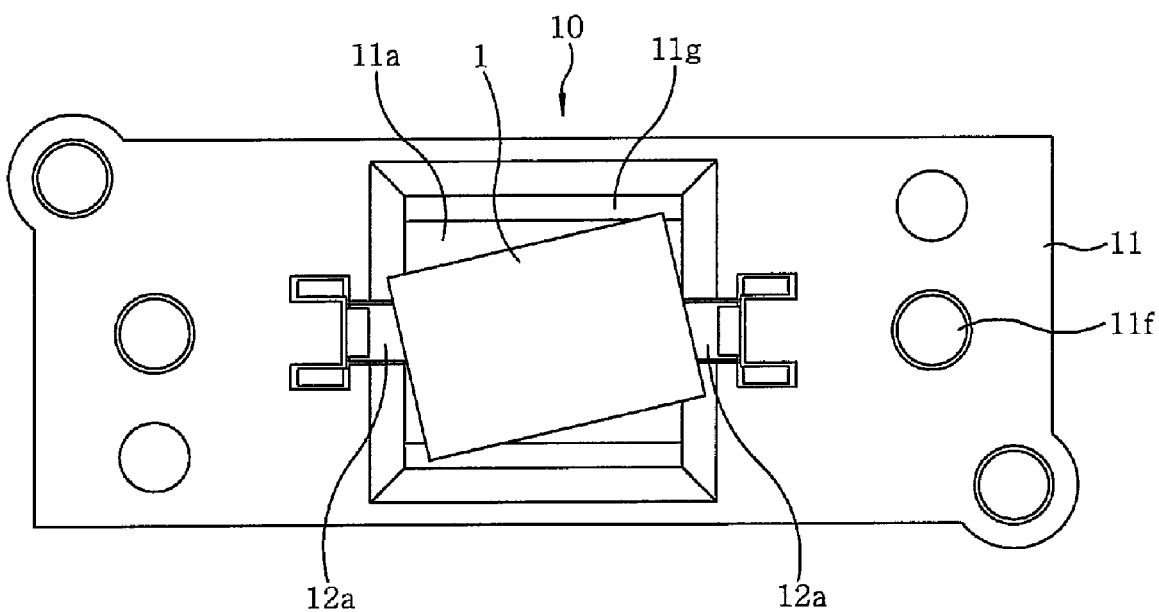
FIG. 2 is a plan view of the insert shown in FIG. 1.
Figure 3:
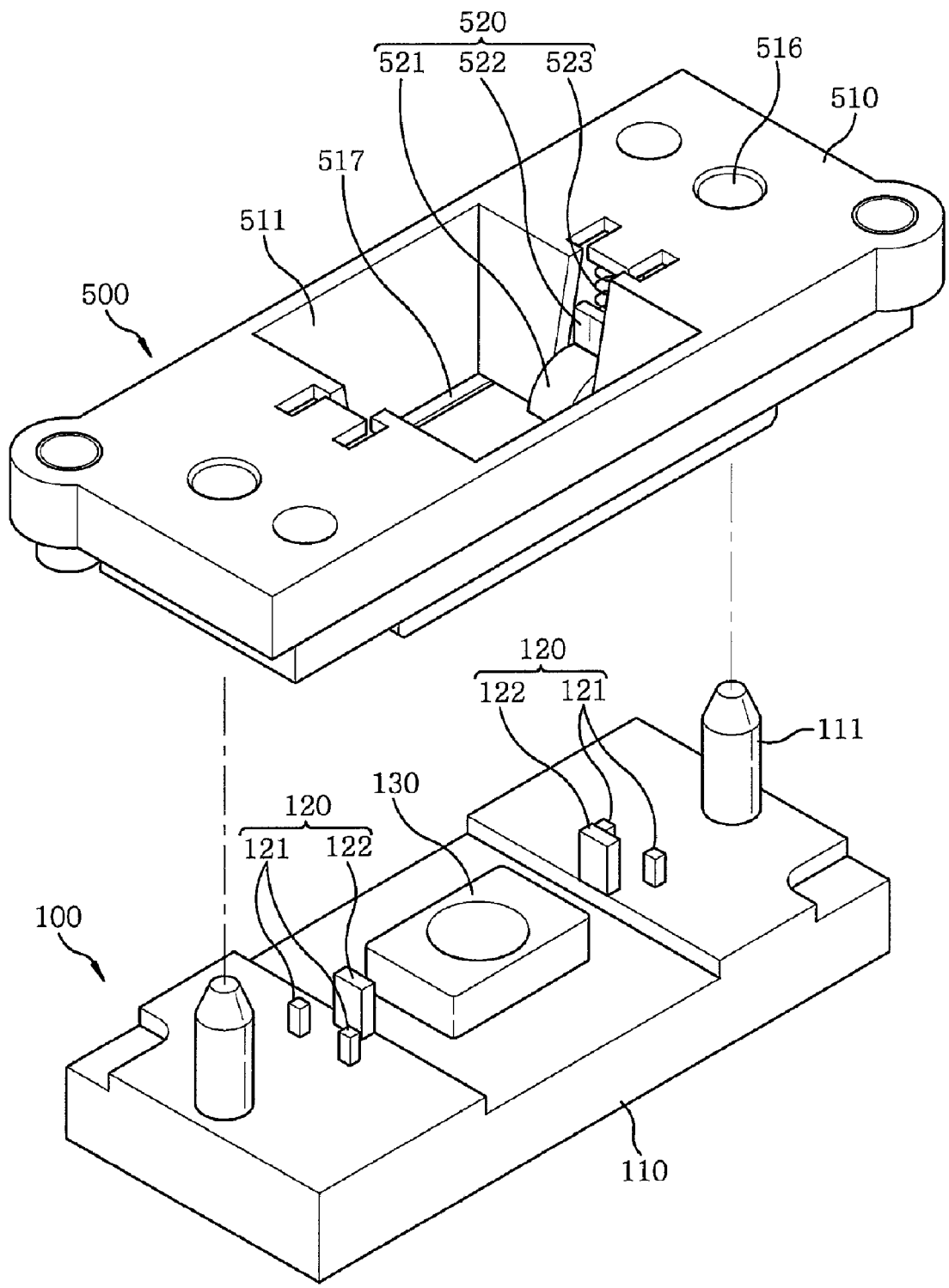
FIG. 3 is a perspective view illustrating a unit for opening an insert for a test tray in accordance with a first embodiment of the present invention.

FIG. 3 is a perspective view illustrating a unit for opening an insert for a test tray according to a first embodiment of the present invention. As illustrated, a unit 100 for opening an insert 500 for a test tray according to the first embodiment of the present invention is arranged in the same matrix for as the arrangement of the inserts 500 and is located on the lower side of the test tray, in order to open the insert 500. The insert opening unit 100 includes a body 110, a pair of opening devices 120 provided in the body 110 to open the insert 500, and a positioning guide unit 130 supporting a semiconductor device when an accommodating space 511 of the insert 500 is opened.

The body 110 includes position determining protrusions 111 respectively positioned to correspond to the position determining holes 516 provided in the insert 500 and protruding upward from the top surface of the body 110, and the opening devices 120 for opening the insert 500 formed on the top surface of the body 110.

The opening devices 120 are formed on the top surface of the body 110 and correspond to a pair of holding units 520 of the insert 500 respectively. Each of the opening devices 120 includes a pair of releasing pins 121 and an opening pin 122.

The releasing pins 121 are positioned on the directly lower side of locking members 522 of the insert 500 and protrude upward from the top surface of the body 110 to push upward the bottom ends of the locking members 522 to rise when the accommodating space 511 of the insert 500 is opened, and press both sides of the bottom ends of the locking members 522 to avoid interference with holding members 521 of the insert 500.

The opening pins 122 protrude from the top surface of the body 110 in order to rotate the holding members 521 such that the holding members 521 open the accommodating space 511.

The positioning guide unit 130 protrudes from the top surface of the body 110 to be inserted into the accommodating space 511 through the lower side of the accommodating space 511 when the accommodating space 511 of the insert 500 is opened, that is, when the accommodating space 511 of the insert 500 is opened by the opening devices 120 as the body 110 moves upward, and supports the semiconductor device that is transferred into the accommodating space 511 to be spaced upward apart from the support 517 formed on the bottom surface of the accommodating space 511.

The top surface of the positioning guide unit 130 has a preset area to support the bottom surface of the semiconductor device, is positioned higher than the top surface of the support 517 when the positioning guide unit 130 is inserted into the accommodating space 511. In order to close the accommodating space 511 while supporting the semiconductor device to be spaced apart from the support 517, the positioning guide unit 130 lowers the semiconductor device together with the body 100 when the body 110 is lowered and guides the semiconductor device such that the semiconductor device is normally positioned at a desired position of the support 517.

Figure 4:
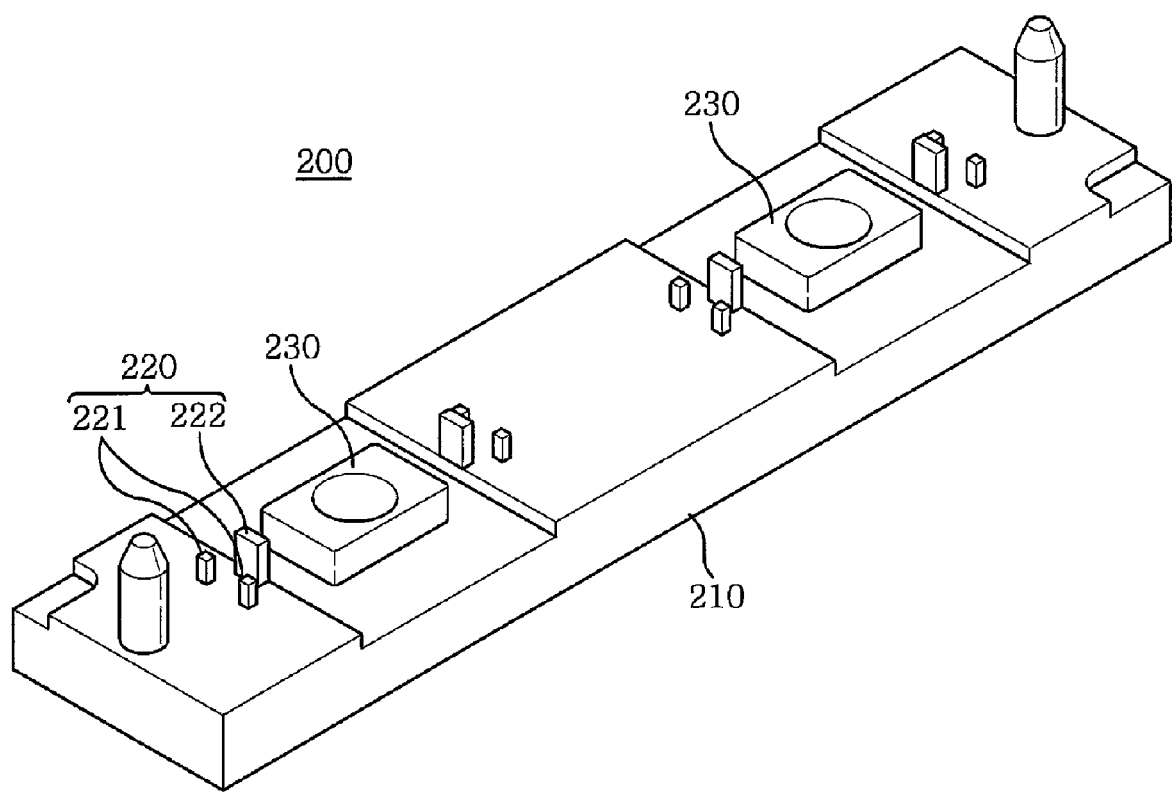
FIG. 4 is a perspective view illustrating a unit for opening an insert for a test tray in accordance with a second embodiment of the present invention.

FIG. 4 is a perspective view illustrating a unit for opening an insert for a test tray according to a second embodiment of the present invention. As illustrated, since a unit 200 for opening an insert for a test tray according to the second embodiment of the present invention includes a body 210, a plurality of pairs of opening devices 220, and a plurality of positioning guide units 230 as in the first embodiment of the present invention and is used to open an insert having a plurality of accommodating spaces into which semiconductor devices are mounted, only the portions of the insert opening unit 200 different from the insert opening unit 100 according to the first embodiment of the present invention will be described as follows.

The insert opening unit 200 includes a plurality of positioning guide units 230 corresponding to the number of the accommodating spaces. In this embodiment, two positioning guide units 230 are illustrated, and a pair of opening devices 220 including a pair of releasing pins 221 and an opening pin 222 is provided on both sides of each of the positioning units 230 to open the holding units of the insert respectively. Therefore, the semiconductor devices transferred into the accommodating spaces formed in the insert are guided to be normally positioned at desired positions of the supports respectively.

Figure 5:
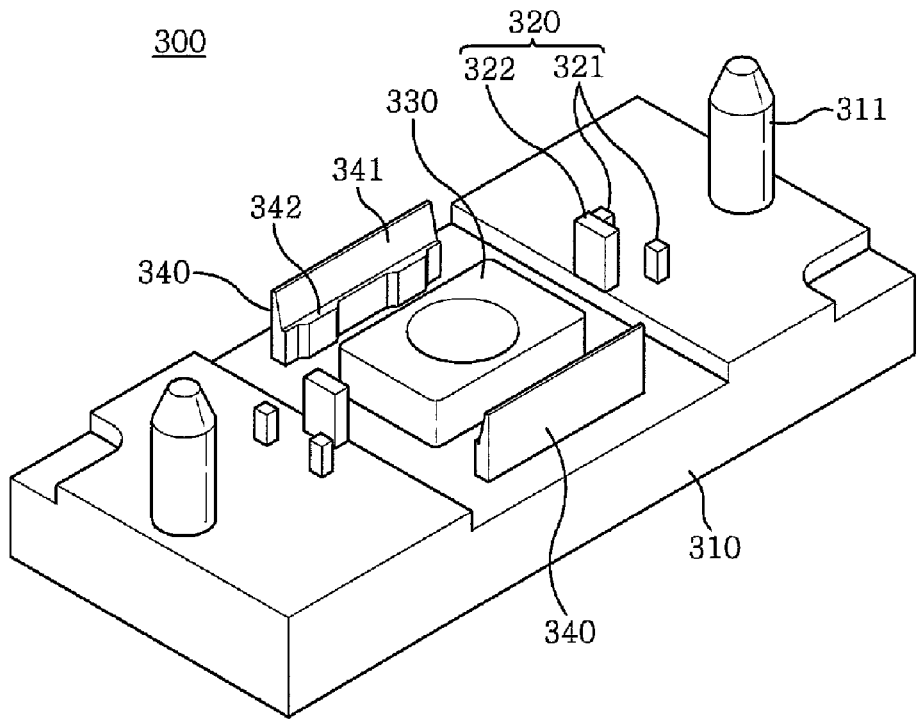
FIG. 5 is a perspective view illustrating a unit for opening an insert for a test tray in accordance with a third embodiment of the present invention.

FIG. 5 is a perspective view illustrating a unit for opening an insert for a test tray according to a third embodiment of the present invention. As illustrated, a unit 300 for opening an insert for a test tray according to the third embodiment of the present invention includes a body 310, a pair of opening devices 320 each of which includes a pair of releasing pins 321 and an opening pin 322, a positioning guide unit 330, and arranging guides 340. The body 310, the opening devices 320, and the positioning guide unit 330 are the identical to those of the first embodiment of the present invention, and their description thereof will be omitted.

The arranging guides 340 guide a semiconductor device positioned on the positioning guide unit 330 to be arranged and are formed vertically in the body on both sides of the positioning guide unit 330 to be inserted into an accommodating space 511 (See FIG. 3) when the accommodating space 511 of the insert 500 (See FIG. 3) is opened. In this case, in the insert 500, the supports 517 (See FIG. 3) are installed parallel to the holding unit 520 (See FIG. 3).

The arranging guides 340 include slopes 341 on sides thereof facing each other to guide both lateral sides of the semiconductor device transferred downward to be positioned at a preset position of the positioning guide unit 330, and supporting steps supporting the lateral sides of the semiconductor device and formed at the bottom ends of the slopes 341 to stop the semiconductor device descending along the slopes 341.

Preferably, the supporting steps 342 have a height suitable for guiding and normally positioning the semiconductor device onto the positioning guide unit 330 by stopping descending of the semiconductor device and have the same height as that of the top surface of the positioning guide unit 330.

In the insert opening unit 300 according to the third embodiment, when the semiconductor device transferred to the accommodating space 511 (See FIG. 3) is lowered to be positioned on the positioning guide unit 330, the arranging guides 340 guide the lateral sides of the semiconductor device lowering along the slopes 341 to primarily arrange and position the semiconductor device at a preset position on the top surface of the positioning guide unit 330. Then, the positioning guide unit 330 lowers the semiconductor device while holding the same to be spaced apart from the top surface of the support 517 (See FIG. 3) again to guide the semiconductor device to be normally positioned at a preset position of the support 517 (See FIG. 3). The semiconductor device is arranged by the arranging guides 340 primarily and is more correctly mounted by the positioning guide unit 330.

Figure 6:
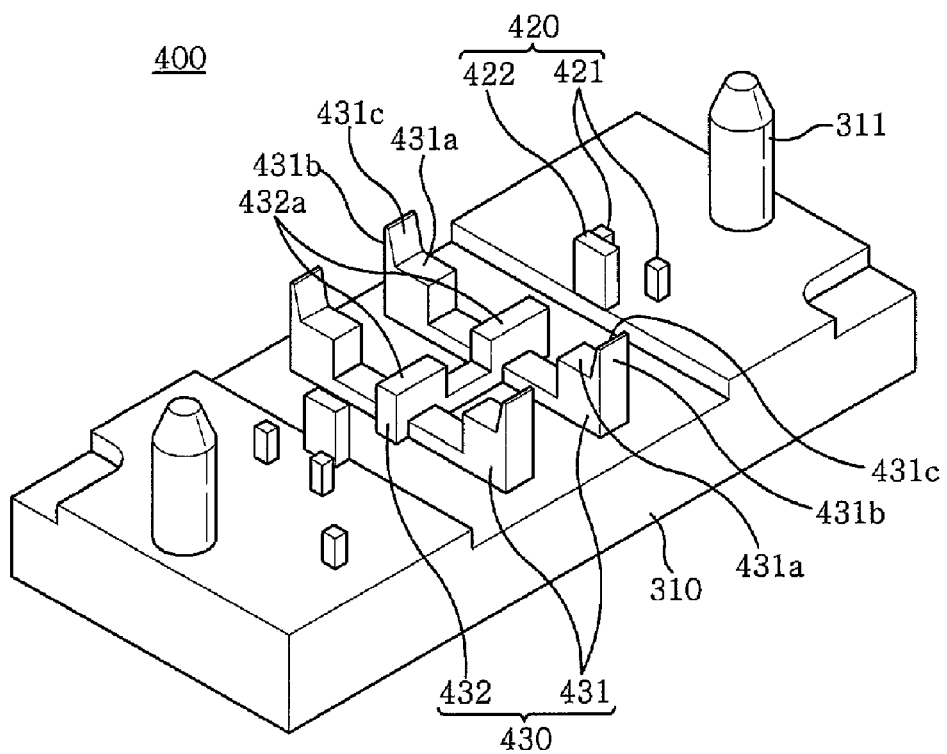
FIG. 6 is a perspective view illustrating a unit for opening an insert for a test tray in accordance with a fourth embodiment of the present invention.

FIG. 6 is a perspective view illustrating a unit for opening an insert for a test tray according to a fourth embodiment of the present invention. As illustrated, a unit 400 for opening an insert for a test tray according to the fourth embodiment of the present invention includes a body 410, a pair of opening devices 420 each of which has a pair of releasing pins 421 and an opening pin 422, and a pair of positioning guide units 430. The body 410 and the opening devices 420 are identical to the body 110 and the opening devices 120 of the insert opening unit according to the first embodiment, and their description thereof will be omitted.

Each of the positioning guide unit 430 includes a plurality of support blocks 431 and 432 partially supporting the bottom surface of the semiconductor device, and the contact area of the positioning guide unit 430 can be minimized by allowing the support blocks 431 and 432 to partially support the bottom surface of the semiconductor device. The numbers, sizes, and arrangements of the support blocks 431 and 432 may be determined according to the type of the semiconductor device.

The supporting blocks 431 and 421 include one or at least two first blocks 431 having first supporting ends 431a supporting lower lateral sides of the semiconductor device and guide protrusions 431b formed at the both sides thereof and having slopes 431c such that the downwardly transferred semiconductor device is positioned at the preset position, and one or at least two second blocks 432 having second supporting ends 432a respectively positioned between the first supporting ends 431a to support the lower side of the semiconductor device.

Therefore, in the insert opening unit 400 according to the fourth embodiment, when the semiconductor device transferred into the accommodating space 511 (See FIG. 3) is lowered to be positioned on the positioning guide unit 430, the guide protrusions 431b guide the lateral sides of the semiconductor device lowering along the slopes 431c so that the semiconductor device is primarily arranged and positioned at preset positions of the first and second supporting ends 431a and 432b of the first and second blocks 431 and 432 to be supported such that it is spaced upward from the support 517 (See FIG. 3). The semiconductor device is guided to be normally positioned at the preset position of the support 517 (See FIG. 3) by lowering the semiconductor device.

Meanwhile, the insert opening units 100, 200, 300, 400 according to the present invention can be applied to various semiconductor devices such as a ball grid array (BGA) and small outline package (SOP), and the sizes and shapes of the positioning guide units 130, 230, 330, and 430 and the arranging guides 340 may be variously determined according to the size and shape of the semiconductor device.

Hereinafter, a method for mounting a semiconductor device by the unit for opening an insert for a test tray according to the present invention will be described in detail.

FIGS. 7 to 10 sequentially illustrate a method of mounting a semiconductor device according to an embodiment of the present invention. As illustrated, in the semiconductor device mounting method of a according to this embodiment of the present invention, a semiconductor device is transferred into an accommodating space 511 of an insert 500 for a test tray and is mounted to a support 517 provided in the accommodating space 511, and the method performed in the insert opening unit 100 according to the first embodiment of the present invention will be illustrated as an example.

The semiconductor device mounting method a according to this embodiment includes opening an accommodating space, transferring a semiconductor device into the accommodating space, supporting the semiconductor device transferred into the accommodating space to be spaced upwardly apart from the support, and lowering the semiconductor device to be positioned on the support and closing the accommodating space.

Figure 7:
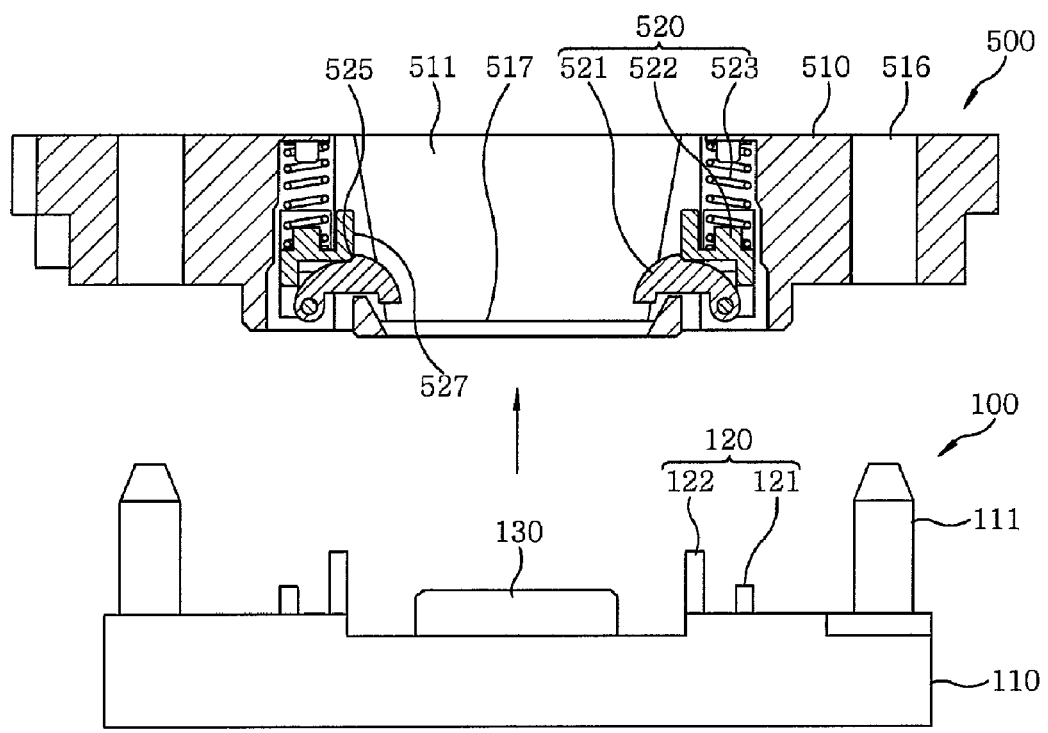
FIGS. 7 to 10 are views sequentially illustrating a method of mounting a semiconductor device in accordance with an embodiment of the present invention.
Figure 8:
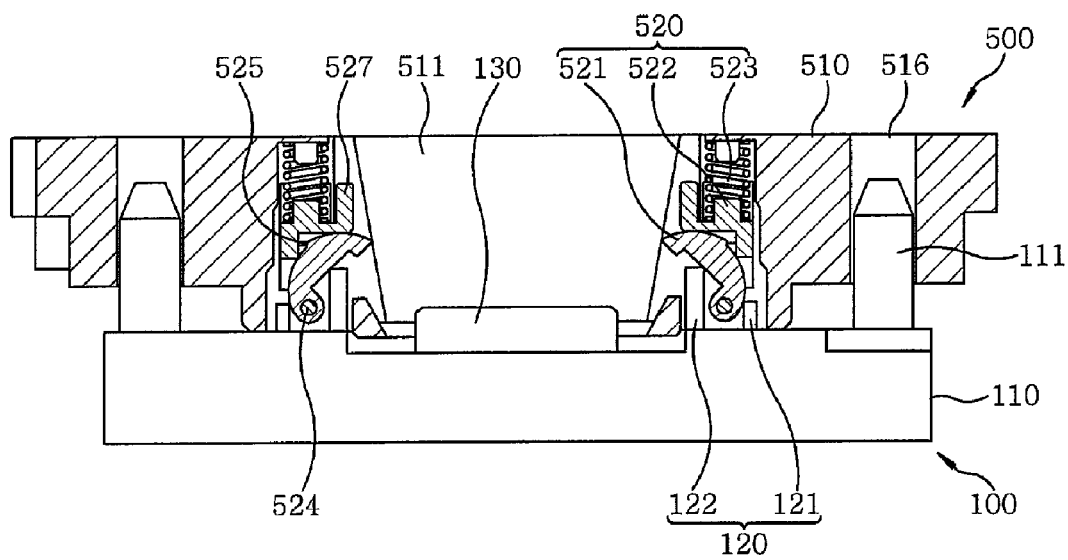

As illustrated in FIG. 7, when a test tray is transferred to a loading position of the semiconductor device and an insert 500 provided in the test tray is positioned on the insert opening unit 100, the insert opening unit 100 is raised and position determining protrusions 111 are inserted into position determining holes 516 of a housing 510 to determine a proper position between the unit 100 and the insert 500 as illustrated in FIG. 8. The insert opening unit 100 is further raised to allow releasing pins 121 to press the bottom ends of the locking members 522 such that the locking members 522 are raised and lockers 527 of locking members 522 release locking steps 525. At this time, opening pins 122 push holding members 521 upward so that the holding members 521 are rotated about hinge pins 524 to open the accommodating space 511 of the housing 510. Then, a positioning guide unit 130 is inserted into the accommodating space 511 through an opened lower portion of the accommodating space 511 and is positioned higher than the support 517.

Figure 9:
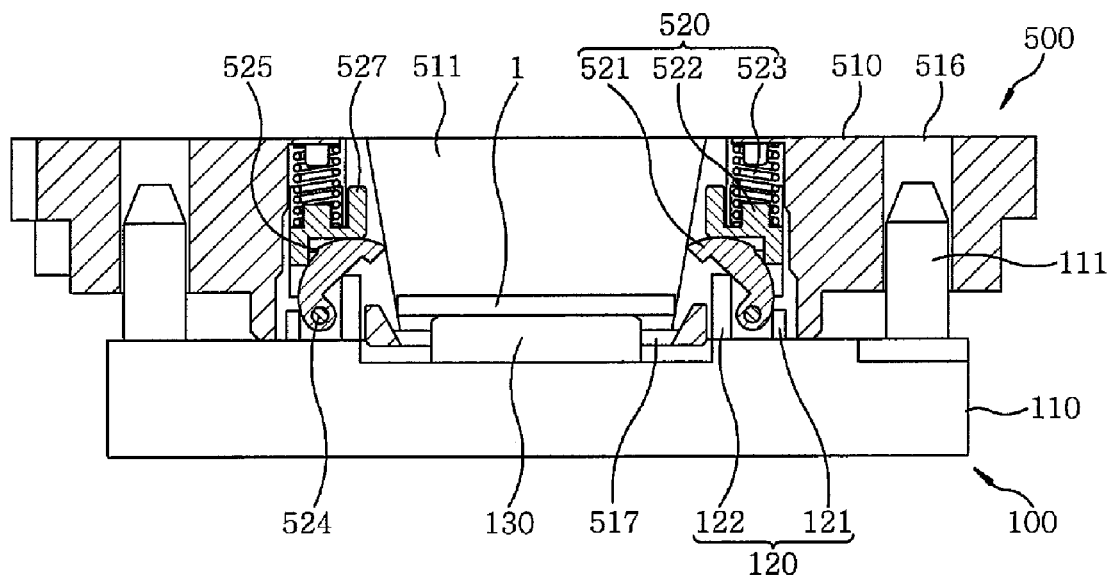

As illustrated in FIG. 9, when the accommodating space 511 is opened, a pick and place unit transfers the semiconductor device 1 into the accommodating space 511 and positions the semiconductor device 1 on the positioning guide unit 130 so that the semiconductor device 1 in the accommodating space 511 is supported by maintaining a distance upward from the support 517.

Figure 10:
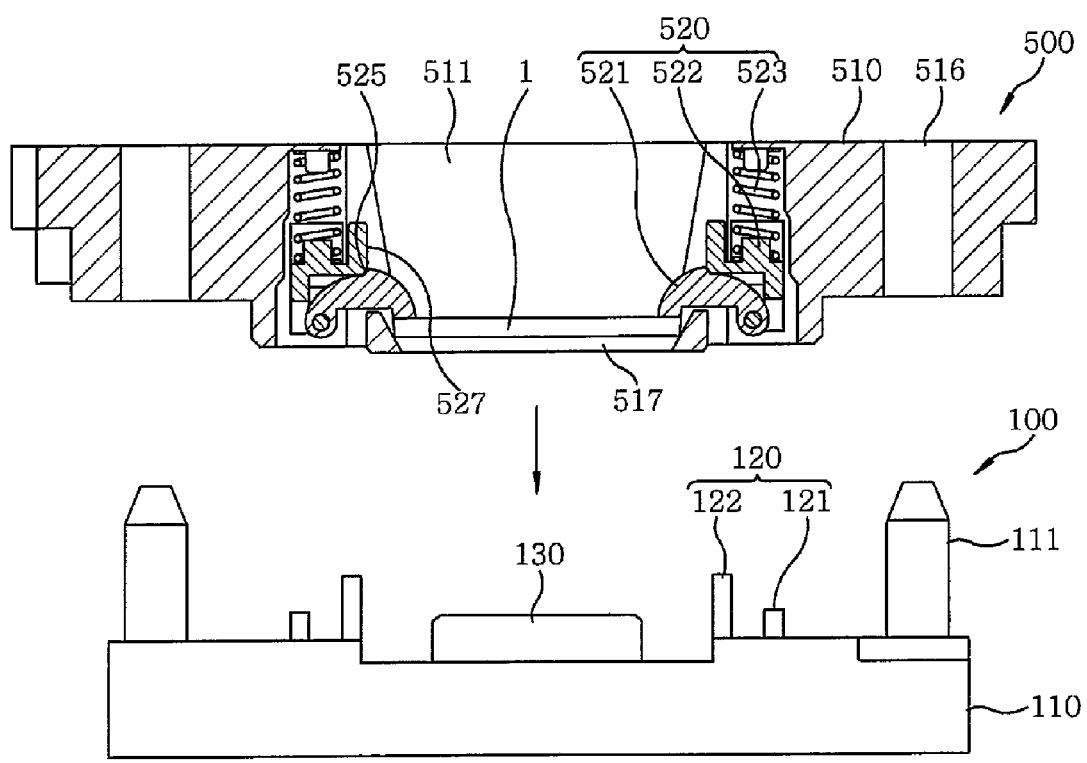

As illustrated in FIG. 10, when the semiconductor device 1 positioned on the positioning guide unit 130 is lowered by lowering the insert opening unit 100 to support the semiconductor device 1 on the support 517 provided on the lower side of the accommodating space 511, the opening pins 122 and the releasing pins 121 are separated from the holding members 521 and the locking members 522. Then, the locking members 522 are lowered and returned by the elastic forces of springs 523 to rotate the holding members 521 about the hinge pins 524 toward the initial positions and to securely hold both lateral sides of the semiconductor device 1 positioned on the support 517 by closing the accommodating space 511.

According to the present invention, after a semiconductor device transferred into an accommodating space of an insert is supported with the semiconductor device being spaced upward apart from a support, that is, a final position, the semiconductor device is lowered and guided and is normally positioned at a preset position on the support. Therefore, a semiconductor is prevented from being abnormally mounted and being separated and damaged in the process of transferring the semiconductor device for a test. Moreover, a semiconductor is prevented from being tested with the semiconductor being abnormally mounted to prevent test equipment from being damaged.

While the invention has been shown and described with respect to the preferred embodiments, it will be understood by those skilled in the art that various changes and modifications may be made without departing from the scope of the invention as defined in the following claims.

What is claimed is:

1. A unit for opening an insert of a test tray which comprises an accommodating space for accommodating a semiconductor device, a support for supporting the semiconductor device accommodated in the accommodating space, and a pair of holding members for being rotated to open and close the accommodating space, the unit comprising:
   a body;
   a pair of opening devices provided in the body and having opening pins for rotating the holding members to open the accommodating space; and
   a positioning guide unit protruding to be inserted into the accommodating space when opening the accommodating space,
   wherein the positioning guide unit inserted into the accommodating space supports the semiconductor device that is transferred into the accommodating space to be spaced upward apart from the support, and
   wherein, when closing the accommodating space, the positioning guide unit lowers the semiconductor device that is supported by the positioning guide unit to position the semiconductor device on the support,
   wherein the support is fixedly formed at a bottom of the accommodating space, and
   wherein the opening pins are inserted into the insert when opening the accommodating space.

2. The unit according to claim 1, further comprising arranging guides formed vertically in the body on both sides of the positioning guide unit to be inserted into the accommodating space when the accommodating space is opened and each of which includes a slope such that a downwardly transferred semiconductor device is positioned on a preset position of the positioning guide unit.

3. The unit according to claim 2, wherein each of the arranging guides includes a supporting step supporting a side of the semiconductor device.

4. The unit according to claim 1, wherein the positioning guide unit includes a plurality of supporting blocks partially supporting the lower side of the semiconductor device.

5. The unit according to claim 4, wherein each of the supporting blocks comprises:
    one or at least two first blocks including first supporting ends supporting lower lateral sides of the semiconductor device, and guide protrusions formed at the both sides thereof and having slopes such that the downwardly transferred semiconductor device is positioned at the preset position; and
    one or at least two second blocks including second supporting ends respectively formed between the first supporting ends to support the lower side of the semiconductor device.

6. A method of transferring a semiconductor device into an accommodating space of an insert for a test tray and mounting the semiconductor device on a support provided in the accommodating space, the insert including a pair of holding members for being rotated to open and close the accommodating space, the method comprising:
    raising an opening unit having a body, opening pins and a positioning guide unit, so that the opening pins rotate the holding members to open the accommodating space and the positioning guide unit is inserted into the accommodating space;
    transferring the semiconductor device into the accommodating space;
    supporting the semiconductor device transferred into the accommodating space on the positioning guide unit to be spaced upwardly apart from the support; and
    lowering the opening unit, so that the semiconductor device supported by the positioning guide unit is lowered to be positioned on the support and the holding members are rotated to close the accommodating space and hold the semiconductor device therein,
    wherein the support is fixedly formed at a bottom of the accommodating space, and
    wherein the opening pins are inserted into the insert when opening the accommodating space.

7. A unit for opening an insert of a test tray which includes an accommodating space for accommodating a semiconductor device, a support at a bottom of the accommodating space of the insert for supporting the semiconductor device accommodated in the accommodating space, and a pair of holding members for being rotated to open and close the accommodating space, the unit comprising:
    a body;
    a pair of opening devices provided in the body and having opening pins for rotating the holding members to open the accommodating space; and
    a positioning guide unit protruding to be inserted into the accommodating space from below when opening the accommodating space,
    wherein the positioning guide unit inserted into the accommodating space supports the semiconductor device that is transferred into the accommodating space to be spaced upward apart from the support, and
    wherein, when closing the accommodating space, the positioning guide unit lowers the semiconductor device that is supported by the positioning guide unit to position the semiconductor device on the support.

8. The unit according to claim 7, further comprising arranging guides formed vertically in the body on both sides of the positioning guide unit to be inserted into the accommodating space when the accommodating space is opened and each of which includes a slope such that a downwardly transferred semiconductor device is positioned on a preset position of the positioning guide unit.

9. The unit according to claim 8, wherein each of the arranging guides includes a supporting step supporting a side of the semiconductor device.

10. The unit according to claim 7, wherein the positioning guide unit includes a plurality of supporting blocks partially supporting the lower side of the semiconductor device.

11. The unit according to claim 10, wherein each of the supporting blocks comprises:
    one or at least two first blocks including first supporting ends supporting lower lateral sides of the semiconductor device, and guide protrusions formed at the both sides thereof and having slopes such that the downwardly transferred semiconductor device is positioned at the preset position; and
    one or at least two second blocks including second supporting ends respectively formed between the first supporting ends to support the lower side of the semiconductor device.

* * * * *